United States Patent [19]
Jeon et al.

[11] Patent Number: 5,278,797
[45] Date of Patent: Jan. 11, 1994

[54] SEMICONDUCTOR MEMORY DEVICE CAPABLE OF EXECUTING NON-PERIODIC REFRESHING OPERATIONS

[75] Inventors: Jun-Young Jeon; Dae-Je Jin, both of Seoul, Rep. of Korea

[73] Assignee: SamSung Electronics, Co. Ltd., Suwon, Rep. of Korea

[21] Appl. No.: 726,182

[22] Filed: Jul. 5, 1991

[30] Foreign Application Priority Data

May 16, 1991 [KR] Rep. of Korea .................. 1991-7979

[51] Int. Cl.$^5$ ............................................. G11C 7/00
[52] U.S. Cl. ............................... 365/222; 365/189.07
[58] Field of Search .................. 365/222, 189.07, 210

[56] References Cited

U.S. PATENT DOCUMENTS

| | | | |
|---|---|---|---|
| 4,682,306 | 7/1987 | Sakurai et al. | 365/222 |
| 4,982,369 | 1/1991 | Tatematsu | 365/210 X |
| 5,148,063 | 9/1992 | Hotta | 365/210 X |

FOREIGN PATENT DOCUMENTS 0154293 7/1987 Japan .................. 365/222

Primary Examiner—Robert J. Pascal
Assistant Examiner—Seung Ham
Attorney, Agent, or Firm—Robert E. Bushnell

[57] ABSTRACT

A semiconductor memory device, having cells respectively therein given information through rewriting, i.e., a refreshing operation, capable of performing non-periodic refreshing operations is disclosed. The semiconductor memory element internally includes a refresh request signal generator having a reference memory cell 51 connected to a word line in the memory device. The refresh request signal generator 100A generates refresh request signals only at that moment of erasing of information stored in the memory cell. The outputted refresh request signals cause refresh signals to transfer to the memory cell. Thus, non-periodic refreshing operations can be performed, thereby reducing the power consumption, and increasing the number of data input/output work.

4 Claims, 4 Drawing Sheets

SEMICONDUCTOR MEMORY DEVICE CAPABLE OF EXECUTING NON-PERIODIC REFRESHING OPERATIONS

FIELD OF THE INVENTION

The present invention relates to a semiconductor memory device, such as dynamic random access memory(DRAM) and pseudo static RAM, having a single transistor and a single capacitor, particularly to the semiconductor device executing non-periodic refreshing operation.

BACKGROUND OF THE INVENTION

In a memory cell consisted of a single transistor and a single capacitor, a discharge of the capacitor makes the stored information therein be destroyed and erased. Therefore, the periodical rewriting of the information, called the refreshing operation, is necessary to continuously store the information. The semiconductor device requiring refreshing operation has a memory control circuit, to perform regular refreshing operations, to perform regular refreshing operations at certain time intervals.

FIG. 1 is a system block diagram of the conventional semiconductor memory device performing refreshing operations. The semiconductor device of FIG. 1 uses DRAM as a memory device 100. If the memory device 100 is internally provided with a refresh address generator 80, the refresh address generator 80, shown in the dotted lines, is not needed.

The refreshing operations are regularly and within a certain time interval carried out through signals produced, by various components such as a central processing unit (CPU) 60 for controlling the memory device 100, an address selector 70, a timer and controller 90, and a refresh address generator 80. Generally the time intervals of the refreshing operations, in a dynamic RAM of 1 mega bits, is 8 msec, and this is executed in 512 cycles.

If it is assumed that 2048 cells are connected to a row address, then all the cells of 1 mega bits can be refreshed, i.e., 512×2048=1,048,576 bits. The range of the refreshing operation is determined in dependence upon the refresh characteristics of the semiconductor memory device, and usually, the refresh characteristics at the room temperature (25° C.) are better by about 10 times than that at a high temperature (83° C). However, the range of the refreshing operation is determined by the high temperature refresh characteristics. Therefore, the refreshing operation at room temperature accompany the unnecessary refreshing operations, with the undesirable result that the power consumption is increased, and that the input/output operations of data are restricted by the refreshing operation time.

SUMMARY OF THE INVENTION

It is an object of the present invention to provide a semiconductor memory device non-periodically performing the refreshing operations in dependence upon the temperature thereof.

In achieving the object, the semiconductor memory device according to the present invention is internally provided with a refresh request signal generator, an input and output terminal thereof being connected respectively to a word line of a first row address in the memory element, and a timer and controller.

Further, in achieving the above object, the refresh request signal generator according to the present invention includes: a reference memory cell receiving signals of a word line of a first row address in a memory cell array; a detector receiving the output of the reference memory cell; a comparator for comparing an output of the detector with a reference voltage; and an output terminal for amplifying an output of the comparator.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
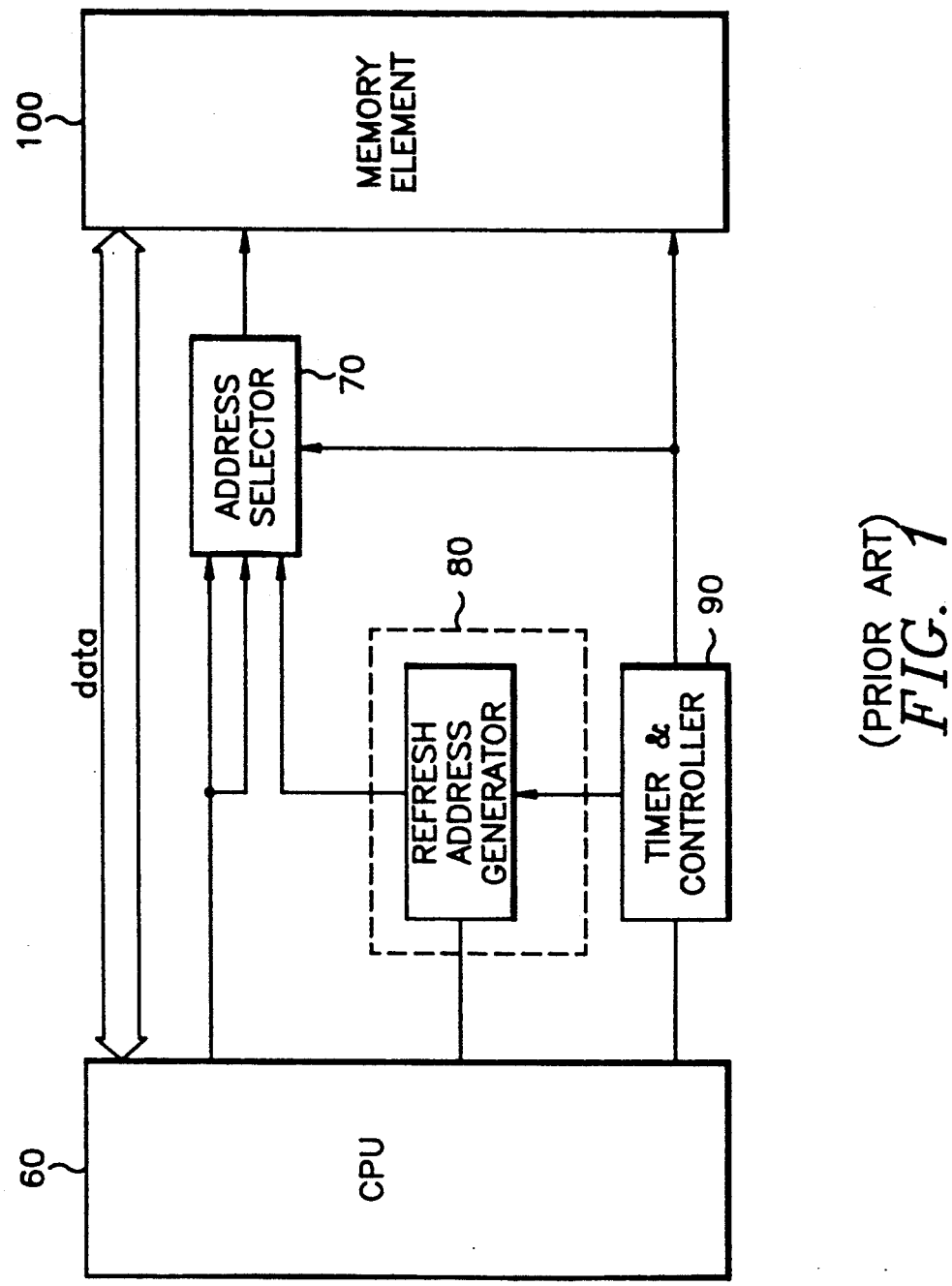
FIG. 1 is a system block diagram of the conventional semiconductor memory device capable of performing refreshing operations.
Figure 2:
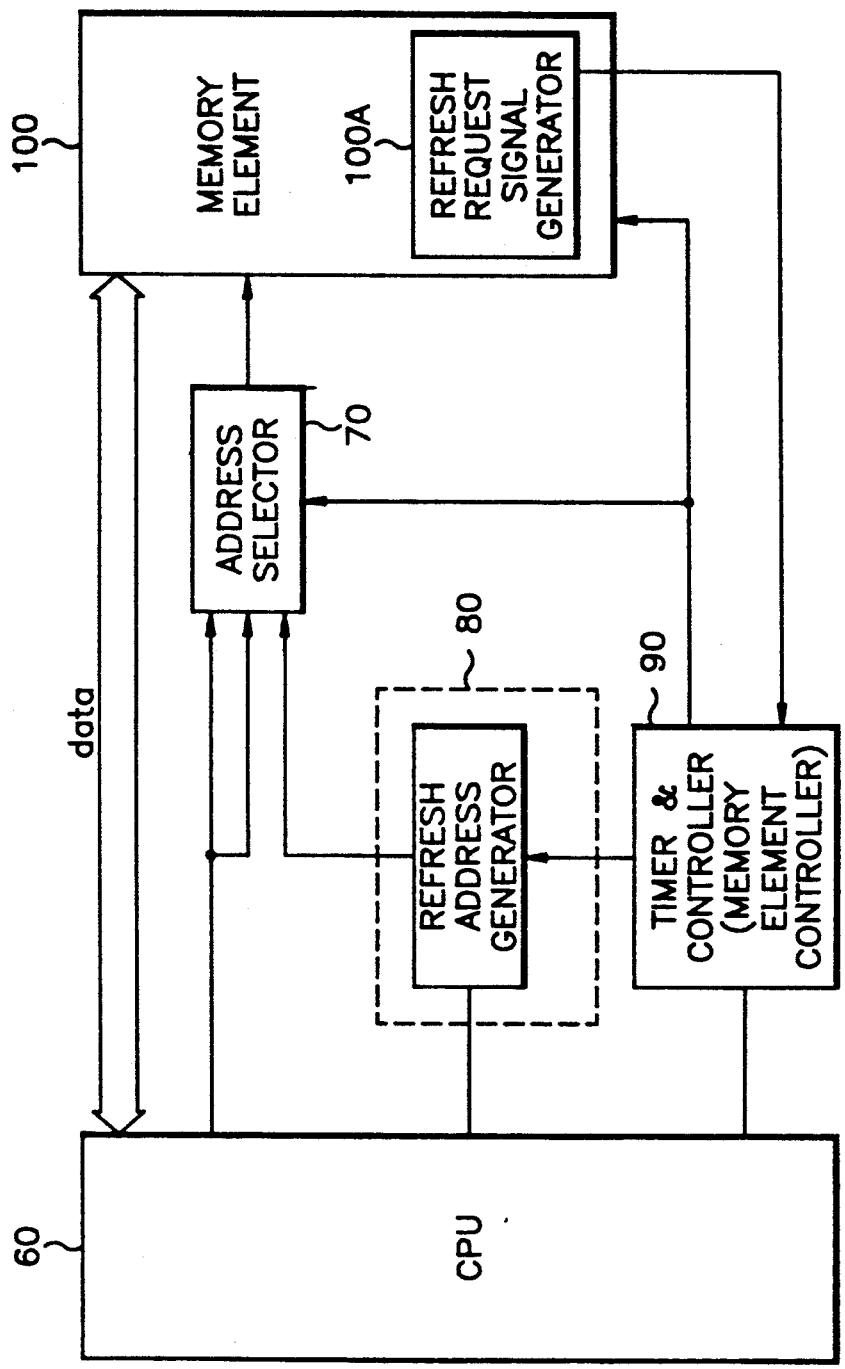
FIG. 2 is a system block diagram of the semiconductor memory device provided with the refresh request signal generator according to the present invention.

FIG. 2 illustrates the connection between a memory element 100 including a refresh request signal generator 100A of the present invention and other components of the system. As shown in FIG. 2, the refresh request memory device 100A installed within the memory device 100, transfers signals of the refresh request memory device 100A to a memory device controller 90.

Figure 3:
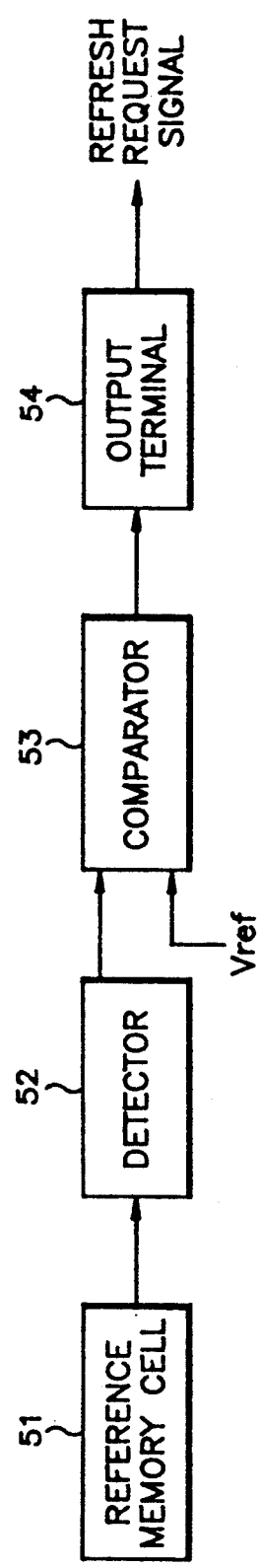
FIG. 3 is a block diagram showing the constitution of the refresh request signal generator according to the present invention.

FIG. 3 is a block diagram showing in a simple form the refresh request signal generator according to the present invention. The refresh request signal generator includes a reference memory cell 51, a detector 52 for detecting the accumulation voltage stored in the reference memory cell 51; a comparator 53 for comparing the detected accumulation voltage with a reference voltage $V_{REF}$, to determine whether a refresh request signal is to be emitted or not; and an output terminal 54 for amplifying the output of the comparator 53.

Figure 4:
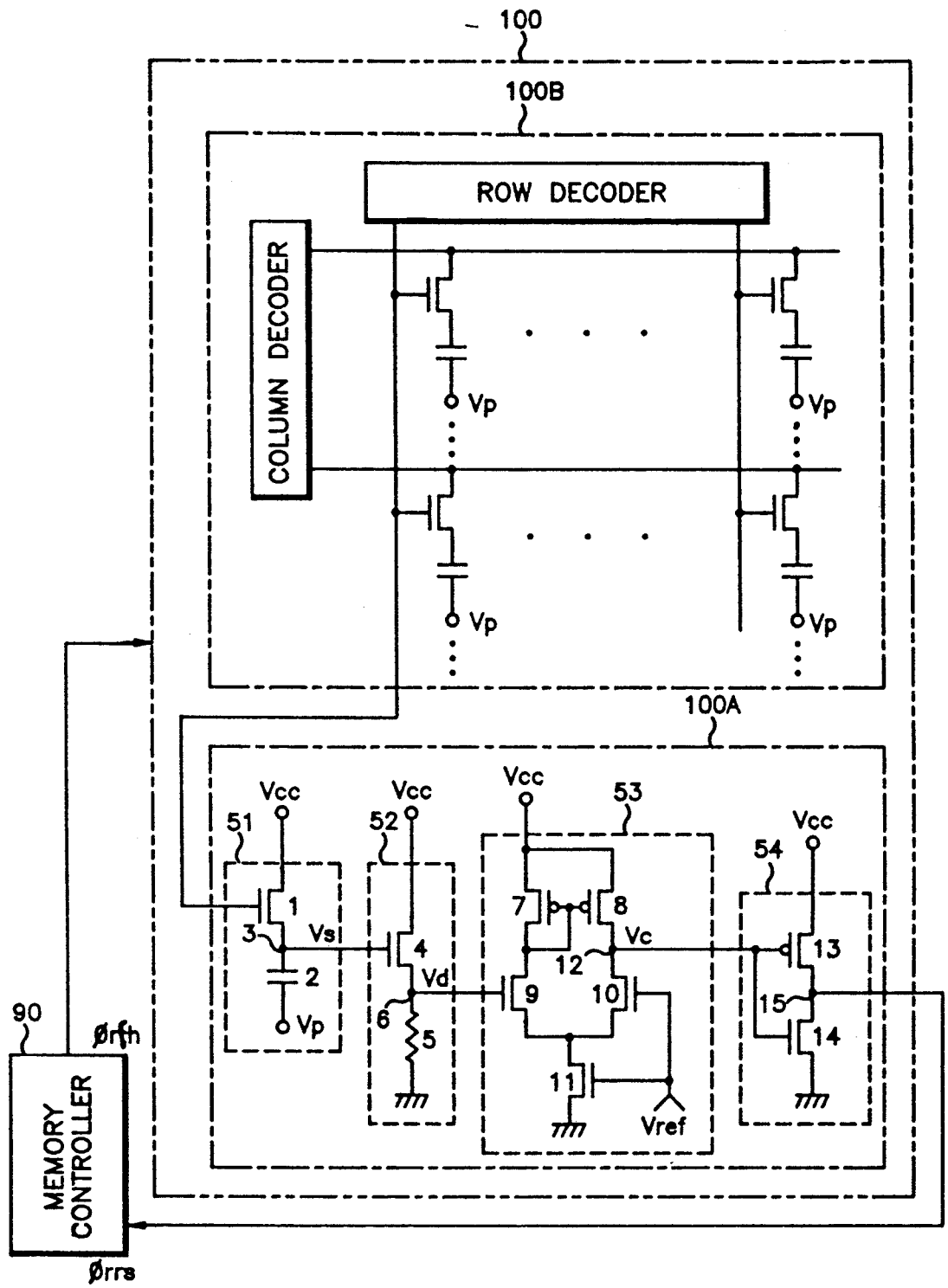
FIG. 4 is a embodiment of the refresh request signal generator according to the present invention.

FIG. 4 illustrates the connection relation between the refresh request signal generator and the memory cell. The refresh request signal generator 100A is installed within the memory element. An output signal $\phi_{RRS}$ of the refresh request signal generator 100A is transferred to the memory controller 90, and in turn the memory controller 90 transfers a refresh signal $\phi_{RFH}$ to the memory element, thereby carrying out a refreshing operation.

The reference memory cell 51 in the refresh request signal generator 100A includes an NMOS transistor 1, a capacitor 2 and an output node 3. The NMOS transistor 1 has a gate connected to a word line of a first row address in a memory cell array 100B, and a drain connected to a power source. The capacitor 2 comprise: a cell plate voltage $V_F$ and a storage node. The output node 3 is commonly connected to a source of the NMOS transistor 1 and the storage node of the capacitor 2. A plurality of the capacitors and the NMOS transistor, like the capacitor 2 and transistor 1 in the reference memory cell 51, can be arranged in parallel between the power source and the cell plate.

The detector 52 includes an NMOS transistor 4, a resistance 5 and an output node 6. The NMOS transistor 4 has a gate connected to the output node 3 of the reference memory cell 51, and a drain connected to the power source $V_{CC}$. One terminal of the resistance 5 is connected to the ground terminal. The output node 6 commonly is connected to the source of the NMOS transistor 3 and the other terminal of the resistance 5.

The comparator 53 includes two PMOS transistor 7, 8, three NMOS transistor 9, 10, 11, and an output node 12. A first the first PMOS transistor 7 has a source connected to the power source $V_{CC}$, and a gate and drain connected to each other. A second PMOS transistor 8 has a source connected to the power source $V_{CC}$, and a gate connected to the gate of the first PMOS transistor 7. A first NMOS transistor 9 includes a gate connected to the output node 6 of the detector 52, and a drain connected to the drain of the first PMOS transistor 7. Also a second NMOS transistor 10 has a gate connected to the reference voltage terminal $V_{REF}$, while a third NMOS transistor 11 has a gate connected to the reference voltage terminal $V_{REF}$, a drain commonly connected to the sources of the first and second NMOS transistors 9, 10, and a source connected to the ground terminal. The output node 12 commonly is connected to the drains of the second PMOS and second NMOS transistors 8, 10, respectively.

The output terminal 54 includes a PMOS transistor 13, an NMOS transistor 14, and an output node 15. The PMOS transistor 13 includes a source connected to the power source $V_{CC}$, and a gate connected to the output node 12 of the comparator 53. The NMOS transistor 14 has a source connected to the ground terminal, and a gate connected to the output node 12 of the comparator 53. The output node 15 commonly is connected to the drains of the PMOS and NMOS transistors 13, 14.

The output terminal 54 is comprised of inverters, and these inverters can be combined in the number of $2n+1$ ($n=0,1,2,3,\ldots$) in order to amplify the output signal $\phi_{RRS}$ to a great degree.

Now the operation of the circuit of FIG. 4 will be described. When the refresh request signal $\phi_{RRS}$ is not generated, meaning that the information in the memory cell is maintained intact, the output node 3 of the reference memory cell 51 is maintained at a $V_{CC}$ level (logic high state). The output node 3 i.e., a storage node, produces a voltage $V_S$ of a high level, to turn on the NMOS transistor 4 of the detector 52. Accordingly, the turn-on resistance of the NMOS transistor 4 in the detector 52 is decreased, so that the output node 6 of the detector 52 outputs a voltage $V_D$ of a high level. The voltage $V_D$ is higher than the reference voltage $V_{REF}$ more than one half of the $V_{CC}$ level. Therefore, the output node 12 of the comparator 53 outputs a voltage $V_C$ of a high level. The voltage $V_C$ of a high level can not drive the output terminal 54 consisted of the inverter, with the result that the refresh request signal $\phi$RRS is not generated. However, if the potential of $V_S$ becomes lower than the reference Voltage $V_{REF}$ due to a leakage current produced at the output node 3 of the reference memory cell 51, the voltage $V_D$ of the detector 52 is produced in a low level equivalent to the ground level. As a result, the first NMOS transistor 9 of the comparator 53 is turned off, and the voltage $V_C$ of the output node 12 of the comparator is produced in a low level. The low level $V_C$ turns on the PMOS transistor 13 of the output terminal 54, and, at the same time, turns off the NMOS transistor 14, with the result that the refresh request signal $\phi_{RRS}$ is generated. Then the memory controller 90 receives the refresh request signal $\phi_{RRS}$, and supplies a refresh signal $\phi_{RFH}$ to the memory element.

Figure 5:
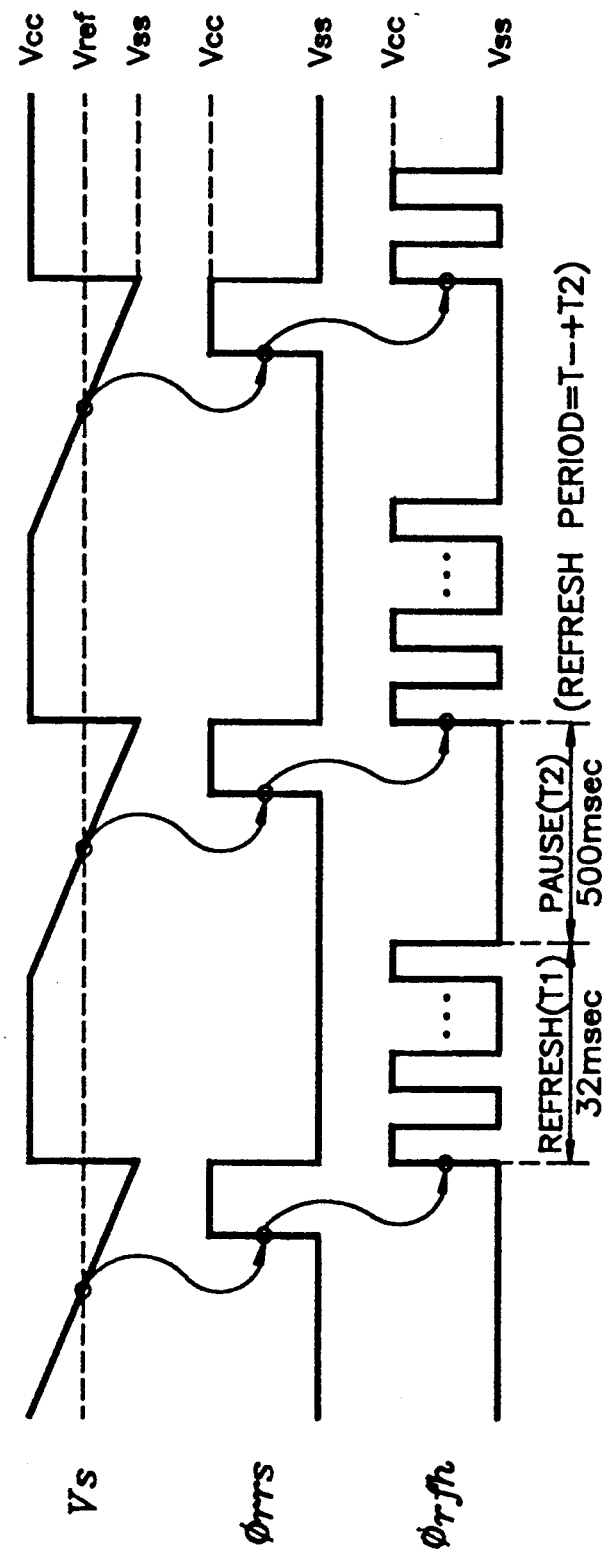
FIG. 5 is a timing chart of the operations of the refresh request signal generator according to the present invention.

FIG. 5 is a timing chart showing the operations of the circuit of FIG. 4. If the voltage $V_S$ of the storage node, i.e., the output node 3 of the reference memory cell 51, comes to be lower than the reference voltage $V_{REF}$, then the refresh request signal $\phi_{RRS}$ can be generated in a high level. That is, the voltage $V_S$ of the storage node, below the reference voltage $V_{REF}$, causes a refresh request signal $\phi_{RRS}$ to be generated from the refresh request signal generator 100A, if the current is discharged through the storage node. The refresh signals $\phi_{RFH}$ are generated as much as the number of the row addresses, in the form of high level clock signals, in dependence upon the refresh request signals $\phi_{RRS}$.

Referring to FIG. 5, a period T1, the refresh signal $\phi_{RFH}$ returning to a high level, is 32 msec, while a period T2, when no refresh signal $\phi_{RFH}$ is generated, is 500 msec. That is, during the period of 500 msec, data input/output operations and other operations can be performed. Further, whereas the conventional refresh signal generator is designed to be operated at high temperatures (over 83° C.), the device of the present invention is designed to be operated only when the storage node voltage of the reference memory cell 51 is below the reference voltage $V_{REF}$, so that refreshing operations should be non-periodically carried out, depending on temperatures thereof.

According to the semiconductor memory device of the present invention, non-periodic refreshing operations make the number of the refreshing operations be decreased. Thereby the inhabitation of reducing of the operation number of the data input/output, and of the unnecessary increase of the power consumption are obtained. Also the speeding up of data processing is achieved. Further, according to the present invention, the refreshing operations of the semiconductor memory device are controlled by the memory controller 90, thus the refreshing operations and the data input/output operations can not occur simultaneously and overlappingly. This solves the delay of the data input/output operations in the conventional virtual static RAM, the delay being based on the fact that when the data input/output operations and the refreshing operations concur, the data input/output operations have to be stopped during the implementation of the refreshing operation.

While the invention has been particularly shown and described with reference to the preferred embodiment thereof, it will be understood by those skilled in the art that the foregoing and other changes in form and details may be made without departing from the spirit and scope of the invention.

What is claimed is:

1. A device for generating refresh request signals capable of rewriting information stored in a memory cell, said device comprising:
   a reference memory cell receiving a signal of a word line in a memory cell array;
   a detector comprising:
      an n type metal-oxide-semiconductor transistor having a gate electrode connected to a first output node of said reference memory cell, and a drain electrode connected to a power source;

a resistance having one terminal thereof connected to a ground terminal; and a second output node commonly connected to a source electrode of said N type metal-oxide-semiconductor transistor and the other terminal of said resistance;

a comparator receiving an output from said second output node and a given reference voltage, to compare said output of said detector with said reference voltage; and an output terminal for amplifying an output of said comparator.

2. A device for generating refresh request signals capable of rewriting information stored in a memory cell, said device comparing:

a reference memory cell receiving a signal of a word line in a memory cell array;

a detector receiving an output of said reference memory cell;

a comparator comprising:

a first P type metal-oxide-semiconductor transistor having a source electrode connected to a power source, and a gate electrode connected to a drain electrode thereof;

a second P type metal-oxide-semiconductor transistor having a source electrode connected to said power source, and a gate electrode, connected to said gate electrode of said first P type metal-oxide-semiconductor transistor;

a first N type metal-oxide semiconductor transistor having a gate electrode connected to an output node of said detector, and a rain electrode connected to said drain electrode of said first P type metal-oxide-semiconductor transistor;

a second N type metal-oxide-semiconductor transistor having the electrode connected to a reference voltage;

a comparator output node commonly connected to said drain electrode of said second P type metal-oxide-semiconductor and said drain electrode of said second N type metal-oxide-semiconductor transistor;

a third N type metal-oxide-semiconductor transistor having a gate electrode connected to said reference voltage, a source electrode connected to a ground terminal, and a drain electrode commonly connected to said source electrodes of said first and second N type metal-oxide-semiconductor transistors; and an output terminal for amplifying an output of said comparator output node.

3. A device for generating refresh request signals capable of rewriting information stored in a memory cell, said device comprising:

a reference memory cell receiving a signal of a word line in a memory cell array;

a detector receiving an output of said reference memory cell;

a comparator receiving an output of said detector and a given reference voltage, to compare said output of said detector with said reference voltage, producing a compared result at a comparator output node; and an output terminal for amplifying an output of said comparator output node, comprising:

a P type metal-oxide-semiconductor transistor having a source electrode connected to a power source, and a gate electrode connected to said comparator output node of said comparator;

an N type metal-oxide-semiconductor transistor having a source electrode connected to a ground terminal, and a gate electrode connected to said comparator output node of said comparator; and an output node commonly connected to the drain electrodes of said P type metal-oxide-semiconductor transistor and said N type metal-oxide-semiconductor transistor.

4. The device as claimed in claim 3, wherein said output node further comprises a plurality of inverters of $2n+1$ ($n=0,1,2,3\ldots$) having a plurality of P type metal-oxide-semiconductor transistors and N type metal-oxide-semiconductor transistors parallely arranged between said power source and said ground terminal.

* * * * *